United States Patent
Carper et al.

[11] Patent Number: 5,837,935
[45] Date of Patent: Nov. 17, 1998

[54] HERMETIC SEAL FOR AN ELECTRONIC COMPONENT HAVING A SECONDARY CHAMBER

[75] Inventors: Judd S. Carper, Colorado Springs; David G. McIntyre, Monument, both of Colo.

[73] Assignee: Ford Motor Company, Dearborn, Mich.

[21] Appl. No.: 606,929

[22] Filed: Feb. 26, 1996

[51] Int. Cl.[6] .................................................. H01L 23/02
[52] U.S. Cl. .......................................... 174/52.4; 257/704
[58] Field of Search ................................ 174/52.2, 52.3, 174/52.4, 50.5; 257/710, 711, 417, 787, 704; 361/760, 761, 762, 763, 764; 438/15, 151, 55, 64

[56] References Cited

U.S. PATENT DOCUMENTS

| | | |
|---|---|---|
| 3,226,610 | 12/1965 | Harman, Jr. et al. . |
| 3,622,419 | 11/1971 | London ................................... 437/209 |
| 3,943,557 | 3/1976 | Frazee et al. . |
| 4,280,885 | 7/1981 | Savery . |
| 4,400,870 | 8/1983 | Islam . |
| 4,426,769 | 1/1984 | Grabbe . |
| 4,427,992 | 1/1984 | Ritchie et al. . |
| 4,533,020 | 8/1985 | Val . |
| 4,769,345 | 9/1988 | Butt et al. . |
| 5,235,135 | 8/1993 | Knecht et al. . |
| 5,317,922 | 6/1994 | Bomback et al. . |
| 5,389,738 | 2/1995 | Piosenka et al. ....................... 174/52.4 |
| 5,405,808 | 4/1995 | Rostoker et al. . |
| 5,448,444 | 9/1995 | Provenzano et al. . |

FOREIGN PATENT DOCUMENTS

| | | |
|---|---|---|
| 2 575 289 | 8/1985 | France . |
| 402058354 | 2/1990 | Japan .................................... 257/704 |
| 403105950 | 5/1991 | Japan .................................... 257/704 |

Primary Examiner—Kristine L. Kincaid
Assistant Examiner—Kristina Soderquist
Attorney, Agent, or Firm—Jospeh W. Malleck

[57] ABSTRACT

A hermetic seal for an electronic component has a cap having a base portion with laterally extending walls. The laterally extending walls define a main chamber therebetween. A cavity is formed in the end of the laterally extending walls to define a secondary chamber and divide the end of the laterally extending walls into a first area and second area. The cap is hermetically sealed to the base at the first and second areas of the laterally extending walls so that the secondary chamber and the main chamber are separately hermetically sealed.

12 Claims, 2 Drawing Sheets

HERMETIC SEAL FOR AN ELECTRONIC COMPONENT HAVING A SECONDARY CHAMBER

FIELD OF THE INVENTION

The present invention relates generally to a hermetic seal for an electronic component, and more specifically to a sealing apparatus having a secondary chamber.

BACKGROUND OF THE INVENTION

Hermetically sealed electronic devices are well known. The simplest form of such a device involves a ceramic package, with a cavity which receives the electronic device, and a metallic lid. The lid is soldered in place such that a hermetic seal is effected. More recently, various approaches to prepare a smaller, more local, hermetic microchamber have been attempted, particularly for Micro Electro Mechanical Systems (MEMS) applications. Typically, a silicon micromachined structure, commonly referred to as a cap, is bonded over the device by thermal compression or anodic bonding techniques.

One problem with this approach is that stresses resulting from cap bonding may degrade the performance or operational characteristics of the device. The temperature dependence of this stress may be quite significant for many MEMS applications such as sensors and actuators. Furthermore, temperature cycling of such a structure in the presence of stress may result in the eventual failure of the hermetic seal. Once a leak occurs, the functional characteristics of the device or its calibration may be altered.

It is, therefore, desirable to improve the quality of the hermetic bond by directly reducing the stress. Further, a technique to sense or monitor any changes in the integrity of the hermetic seal would be highly desirable.

SUMMARY OF THE INVENTION

The present invention overcomes the disadvantages of the related art by providing a cap having a base portion with laterally extending walls. The laterally extending walls define a main chamber therebetween. A cavity is formed in the end of the laterally extending walls to define one or more secondary chamber and divide the end of the laterally extending walls into a first area and second area. The cap is hermetically sealed to the base at the first and second areas of the laterally extending walls to the base. Both the first area and second area are hermetically sealed to seal the secondary chamber from the main chamber and the environment in which the device is used.

An advantage of the present invention is that since the outer wall of the cap is made thinner by the addition of a secondary chamber the wall structure is more flexible and therefore can conform to local non-uniformities in the silicon structure.

Another advantage is stress is reduced over conventional hermetic caps since the area over which to dissipate stress is increased.

Yet another advantage is that the secondary chamber may contain a variety of passive or active devises to monitor the integrity of the chamber.

BRIEF DESCRIPTION OF THE DRAWINGS

These and other objects, advantages, and features of the present invention will be apparent to those skilled in the art upon reading the following description with reference to the accompanying drawings, in which.

DETAILED DESCRIPTION OF THE PREFERRED EMBODIMENT

Figure 1:
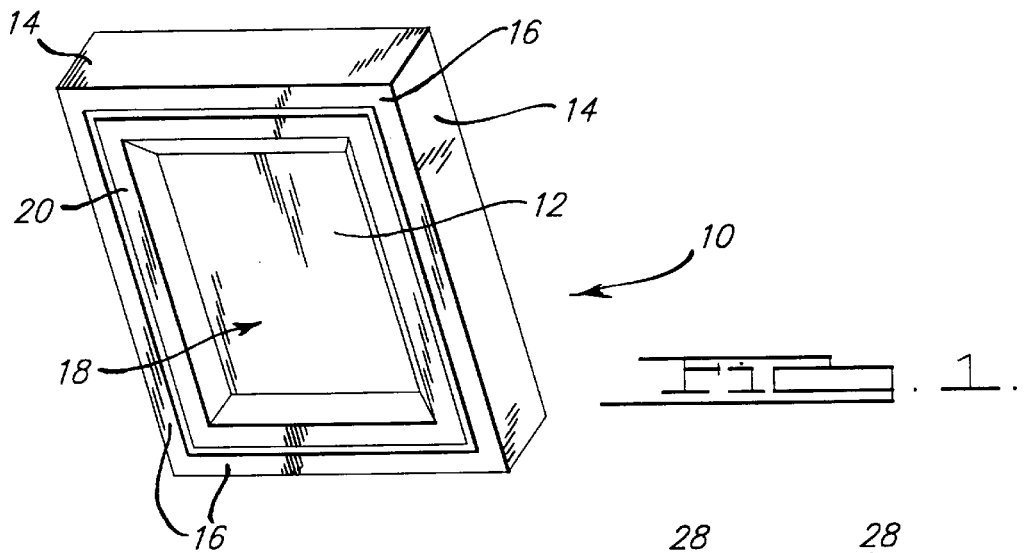
FIG. 1 is a perspective view of a micromachined cap according to the present invention.

Referring to FIG. 1, a cap 10 is shown that is used to encapsulate an electronic structure. Cap 10 has a base portion 12 with laterally extending walls 14. Four laterally extending walls are shown as an example. Any number of walls, however, may be used. Each of walls 14 have an end 16 which are preferably coplanar. A main chamber 18 defined by walls 14 is used for enclosing an electronic component. A cavity 20 is formed into end 16 of laterally extending walls 14. Each of ends 16 preferably has a cavity 20 forming a continuously connected secondary chamber in each of ends 16. Cavity 20 is preferably sized to reduce the surface area of end 16. A cavity having a volume about that of main chamber 18 was found to give desirable results.

Cap 10 is preferably micromachined from a single piece of silicon, glass or ceramic material. The cap as shown is 3 millimeters by 1 millimeter.

Figure 2:
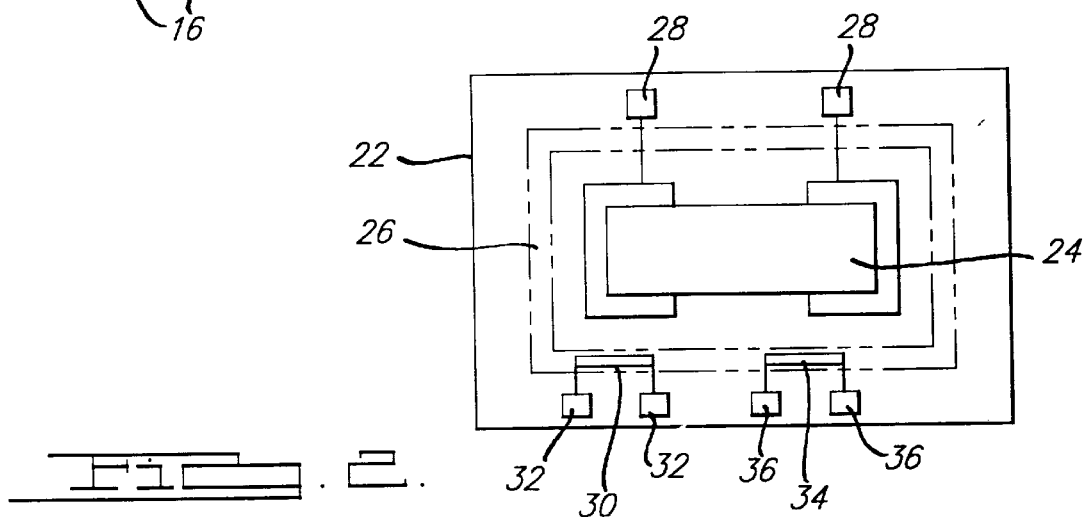
FIG. 2 is a top view of a substrate according to the present invention.

Referring now to FIG. 2, a base 22 is used for housing an electronic structure 24, such as a tilt plate capacitor, as shown, or an integrated circuit. Base 22 is substrate such Pyrex. Pyrex has a different coefficient of thermal expansion than the silicon cap 14. The area 26 corresponding to cavity 20 is shown in phantom lines. Electronic structure 24 has contact pads 28 that are used to connect electronic structure 24 external to cap 10. A gettering alloy 30 may be aligned with the cavity 20 to deliberately induce a pressure differential in the secondary chamber. Gettering alloy 30 has contact pads 32 for activation of gettering alloy 30.

A leak detector 34 may also be incorporated into the secondary chamber. A leak detector 34 may be a pressure sensor, corrosion test structure, a humidity sensor or other methods of sensing a leak in the hermetic seal. Contact pads 36 connect leak detector 34 external to the cap 10.

The secondary chamber may also have a signal conditioning circuit to process the signal. Many signal processing circuitry may include processing such as filtering.

Figure 3:
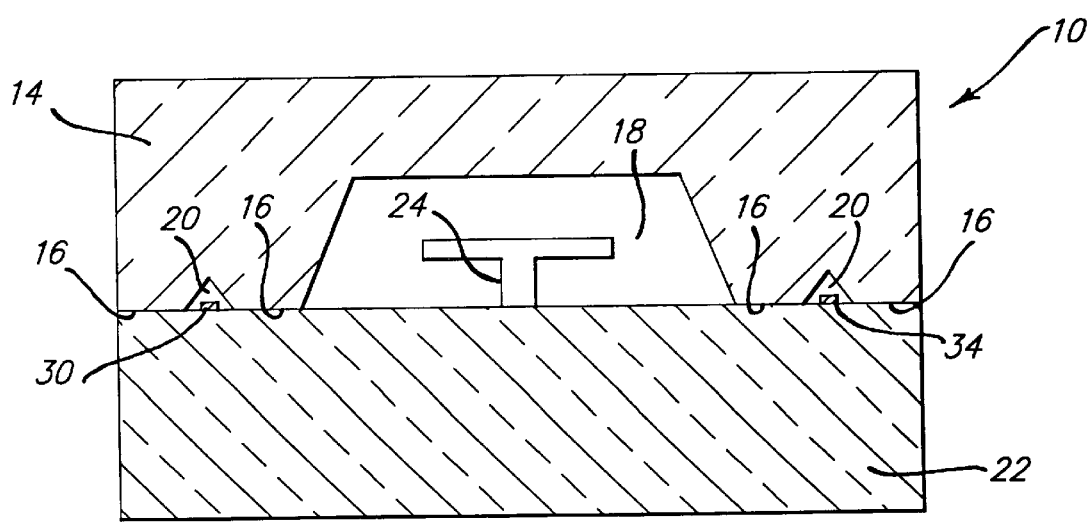
FIG. 3 is a cross sectional view of a cap bonded to a substrate.

Referring now to FIG. 3, a cross sectional view of cap hermetically sealed to base 22 is shown. Typically the hermetic seal is provided anodically or formed by thermal compression bond. Because cap 10 and base 22 are made of different material having different coefficients of thermal expansion, stresses build up in ends 16. Due to the addition of cavity 20 laterally extending walls 14 become more flexible to allow stress to be dissipated. Also because of the flexibility in external laterally extending walls 14 non-planarity of base 22 can be compensated.

Figure 4:
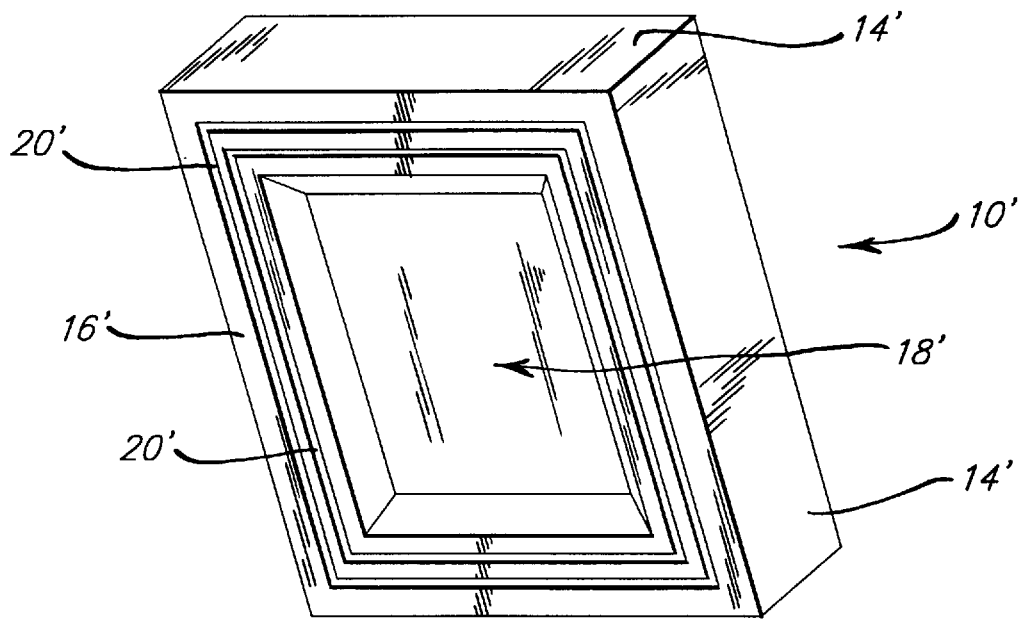
FIG. 4 is an alternative embodiment of a cap according to the present invention.
Figure 5:
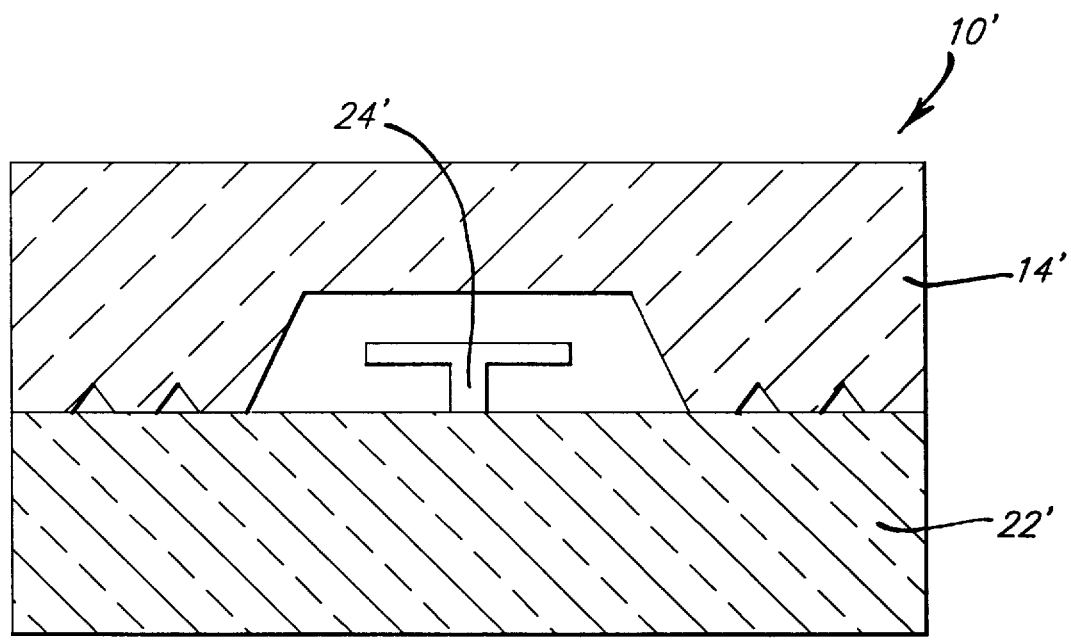
FIG. 5 is a cross sectional view of an alternative embodiment of the present invention.

Referring now to FIGS. 4 and 5, the corresponding structure from that of FIG. 1 is shown. Cap 10' having ends 16' are shown with two cavities 20'. Each or either of cavities 20' may have a leak detection means or a gettering alloy for detection of leaks and inducing pressure differentials in the cavity. By adding an extra cavity 20' laterally extending walls 14' become more flexible which reduces stress and further increases conforming to non-planarity of base 22'. Such a structure also increases the reliability of the encapsulation since both chambers must be violated before the main chamber 18' is violated.

As would be evident to one skilled in the art, several modifications of the invention may be made while still being within the scope of the appended claims. For example, the size and shape of the chambers and the materials of the cap and base may be changed.

What is claimed is:

1. An encapsulating structure for a component comprising:
   a cap having a base portion with a laterally extending wall, said wall having a thickness and an end, said wall defining a main chamber for housing the component therein;
   a cavity formed in said end of said laterally extending wall defining a secondary chamber thereby dividing said end into a first area and a second area;
   a base;
   said first area and said second area each forming a hermetic seal with said base; and
   detection means disposed within said cavity for detecting a failure of one of said seals.

2. An encapsulating structure as recited in claim 1 wherein said detection means comprises a pressure sensor.

3. An encapsulating structure as recited in claim 1 wherein said detection means comprises a humidity sensor.

4. An encapsulating structure as recited in claim 1 wherein said detection means comprises a corrosion test structure.

5. An encapsulating structure as recited in claim 1 wherein said detection means comprises a gettering alloy.

6. An encapsulating structure for a component comprising:
   a cap having a base portion with laterally extending walls, each of said walls having a thickness, said laterally extending walls having an end and defining a main chamber for housing the component therebetween;
   a plurality of substantially parallel cavities formed in the end of said laterally extending walls defining secondary chambers dividing said end into a plurality of areas;
   a base;
   said base and said plurality of areas forming hermetic seals with said base; and
   detection means disposed within one of said cavities for detecting a failure of one of said seals.

7. An encapsulating structure as recited in claim 6 wherein said detection means comprises a pressure sensor.

8. An encapsulating structure as recited in claim 6 wherein said detection means comprises a humidity sensor.

9. An encapsulating structure as recited in claim 6 wherein said detection means comprises a corrosion test structure.

10. An encapsulating structure as recited in claim 6 wherein said detection means comprising a gettering alloy.

11. An encapsulating structure as recited in claim 6 wherein said cap comprises silicon.

12. An encapsulating structure as recited in claim 6 wherein said cavities extend continuously in said end of said cap.

* * * * *